US 6,751,096 B2

(12) United States Patent
Aldon

(10) Patent No.: US 6,751,096 B2
(45) Date of Patent: Jun. 15, 2004

(54) MODULAR ELECTRONIC HOUSING

(75) Inventor: Jean-Claude Aldon, Ringwood, NJ (US)

(73) Assignee: 901D LLC, Tallman, NY (US)

( * ) Notice: Subject to any disclaimer, the term of this patent is extended or adjusted under 35 U.S.C. 154(b) by 0 days.

(21) Appl. No.: 10/222,197

(22) Filed: Aug. 16, 2002

(65) Prior Publication Data

US 2004/0032717 A1 Feb. 19, 2004

(51) Int. Cl.[7] .............................. H05K 5/06; H05K 5/02
(52) U.S. Cl. ........................ 361/695; 361/735; 361/716; 174/35 GC
(58) Field of Search .......................... 312/236, 351.11, 312/351.7, 352; 248/623, 628; 52/167.1, 167.7; 174/16.1, 35 R, 356 C; 361/690, 695, 715, 716, 728, 729, 730, 735, 807, 809, 810, 800, 816, 818

(56) References Cited

U.S. PATENT DOCUMENTS

| 2,173,342 A | | 9/1939 | Rosenzweig |
| 2,597,800 A | | 5/1952 | Hussman |
| 2,687,270 A | | 8/1954 | Robinson |
| 2,904,302 A | | 9/1959 | Cavanaugh et al. |
| 2,942,856 A | * | 6/1960 | Woodward |
| 3,925,710 A | * | 12/1975 | Ebert ........................ 361/690 |
| 4,137,559 A | * | 1/1979 | Reuting ..................... 361/735 |
| 4,251,045 A | | 2/1981 | Meyerle |
| 5,156,451 A | | 10/1992 | Pollock |
| 5,653,070 A | | 8/1997 | Seguin |
| 5,808,866 A | * | 9/1998 | Porter ........................ 361/695 |
| 6,035,524 A | | 3/2000 | Suppa et al. |
| 6,284,970 B1 | * | 9/2001 | Buskmiller et al. ..... 174/35 GC |

OTHER PUBLICATIONS

Document search results by NERAC for Aldon, Seguin, 901D; Dec. 13, 2002; 8 pages.

* cited by examiner

Primary Examiner—Anatoly Vortman
(74) Attorney, Agent, or Firm—Morgan Lewis & Bockius LLP

(57) ABSTRACT

A modular electronic housing system is provided, having a plurality of modules. Each module includes a plurality of bolt holes for attachment of various components and other modules, and a gasket interface for placement of gaskets for electromagnetic shielding or drip proof protection. The electronic housing further includes a removable end panel for convenient access to the contents of the electronic housing, and a support system is provided for isolation—of contents from vibration or shock. The electronic housing is designed to facilitate integration inside submarines or through small hatches. Cabling and wiring do not need to be removed during integration of the electronic housing.

14 Claims, 4 Drawing Sheets

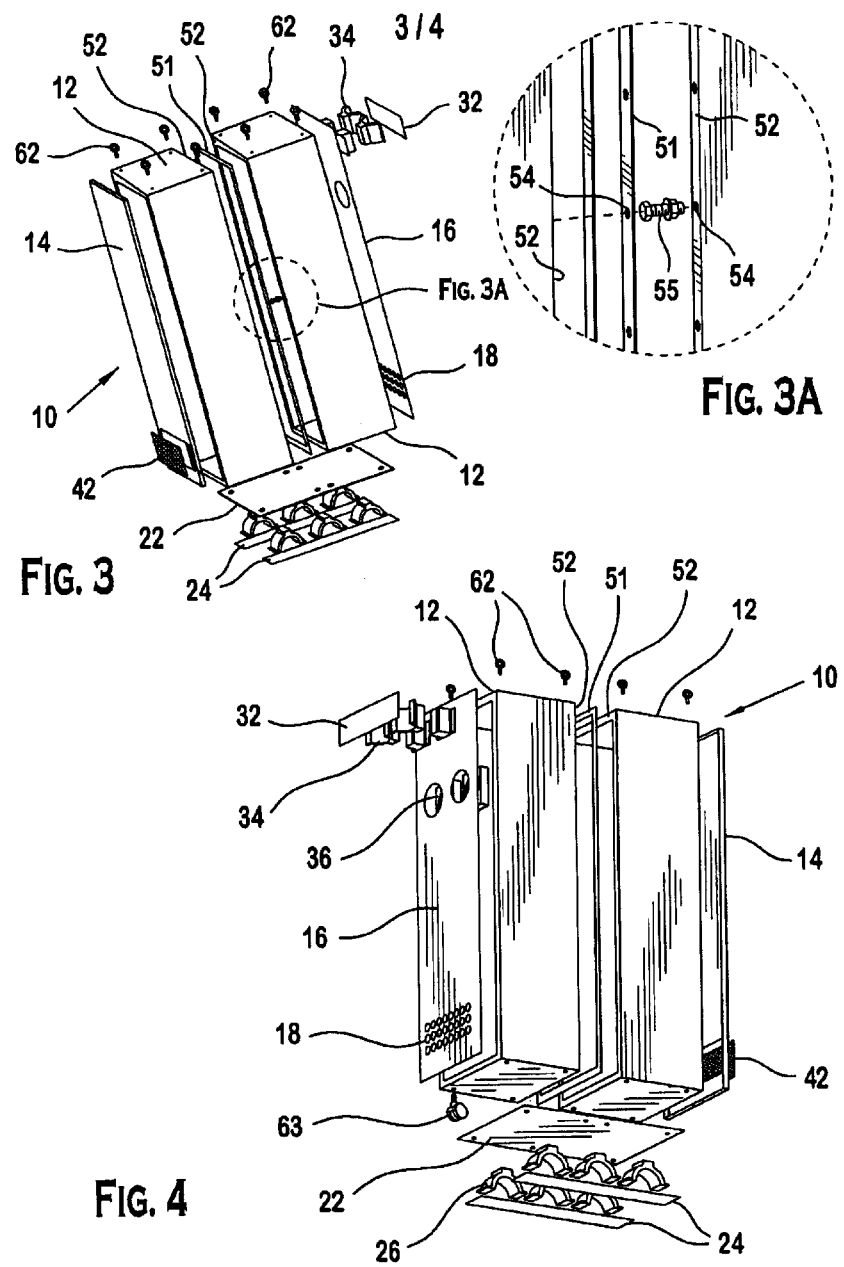

MODULAR ELECTRONIC HOUSING

FIELD OF THE INVENTION

The instant invention generally relates to an electronic housing system. More particularly, the present invention relates to a method, apparatus, and article-of-manufacture for housing electronic sub-assemblies. While the present invention is directed generally to the field of housings for electronic components, it can be readily understood that application of the invention can be readily extended for the housing of other articles or components without detracting materially from the spirit and scope of the invention.

BACKGROUND OF THE INVENTION

Protection from the environment is an important aspect of any housing system. Whether the housing unit is installed in a home or on a ship, protection from potential damage to the articles or components from the environment is of the utmost importance in housing design considerations. This is most evident when sensitive equipment, such as electronic systems, communication units, computers, and other delicate machines are installed and operated in an environment subject to harmful conditions. Examples of potentially harmful conditions may include electromagnetic interference, sharp changes in temperature, moisture, shock, and vibration. These environmental conditions often impair or interfere with the proper function of sensitive equipment. Accordingly, it is imperative that such equipment be housed in a manner that provides for effective isolation from adverse environmental conditions.

Electronic housings designed for military use for protecting electronic equipment, computer systems, and communication units against shock, vibration, and other environmental threats have strict requirements imposed by Army, Navy, and Air Force agencies. These requirements are more stringent than those imposed on civilian installations.

While many existing electronic housing systems have generally been found effective for use in less intense and dangerous environments, few are accepted for use by the military. Another problem is that equipment installed in ships, planes, and other motor vehicles must often be removed and transported to another location. Due to the size of the housings and the sensitivity of the equipment, it may be necessary to provide new housings at the new location. As a result, this increases the expense of relocation, not to mention the enormous effort required in the installation of the new housings. Accordingly, there is a recognized need for a more effective system of protecting sensitive electronic equipment, while keeping costs low, as well as minimizing the effort required for removal and installation.

SUMMARY OF THE INVENTION

Accordingly, it is an object of the present invention to provide an electronic housing.

Another object of the present invention is to provide a modular electronic housing.

It is a further object of the present invention to provide a modular electronic housing that may be easily assembled and disassembled.

It is yet another object of the present invention to provide a modular electronic housing with electromagnetic shielding (typically for MIL STD 461 requirements) and drip proof and water proof protection, typically up to NEMA 4.

It is still a further object of the present invention to provide a modular electronic housing that permits for isolation of its contents from shock and vibration.

The present invention provides a modular electronic housing system, having a plurality of modules. Each module includes a plurality of bolt holes for attachment of various components and other modules, and a gasket interface for placement of gaskets for electromagnetic shielding or drip-proof and protection against ingress of liquids. The electronic housing further includes a removable end panel for convenient access to the contents of the electronic housing. This removable panel can be a simple flat sheet metal plate or any other more sophisticated connector box. An example of a more sophisticated connector box is given at the end of this document.

The electronic housing also includes a support system for isolation of the contents from vibration or shock.

A front door is also part of the complete housing. This door can be designed to accommodate opening for air inlet for example. In such a case, these opening will be protected by EMI honeycomb material to protect electronic sub-assemblies integrated inside the housing from external electromagnetic threats.

These and other features and advantages of the invention will be more fully understood from the following description of specific embodiments of the invention taken together with the accompanying drawings.

BRIEF DESCRIPTION OF THE DRAWINGS

In the drawings:

FIG. 3 depicts the interface between the different modules and an example of how to tied them together;

FIG. 4 is an alternate view of the electronic housing of FIG. 3; and

Corresponding reference characters indicate corresponding parts throughout the several figures of the drawings.

DETAILED DESCRIPTION OF THE INVENTION

Figure 1:
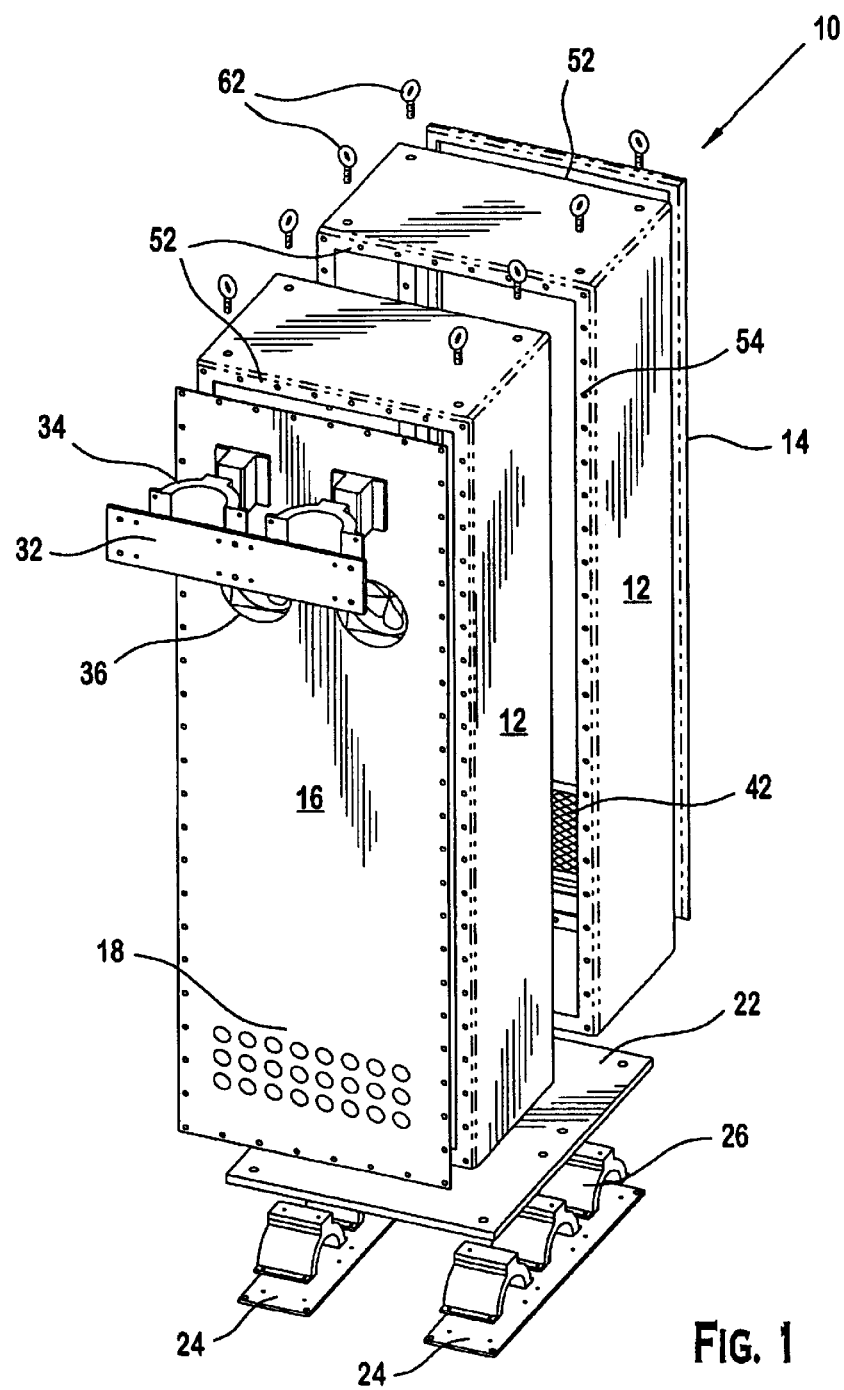
FIG. 1 depicts an exploded view of a representative of an electronic housing of the present invention.
Figure 2:
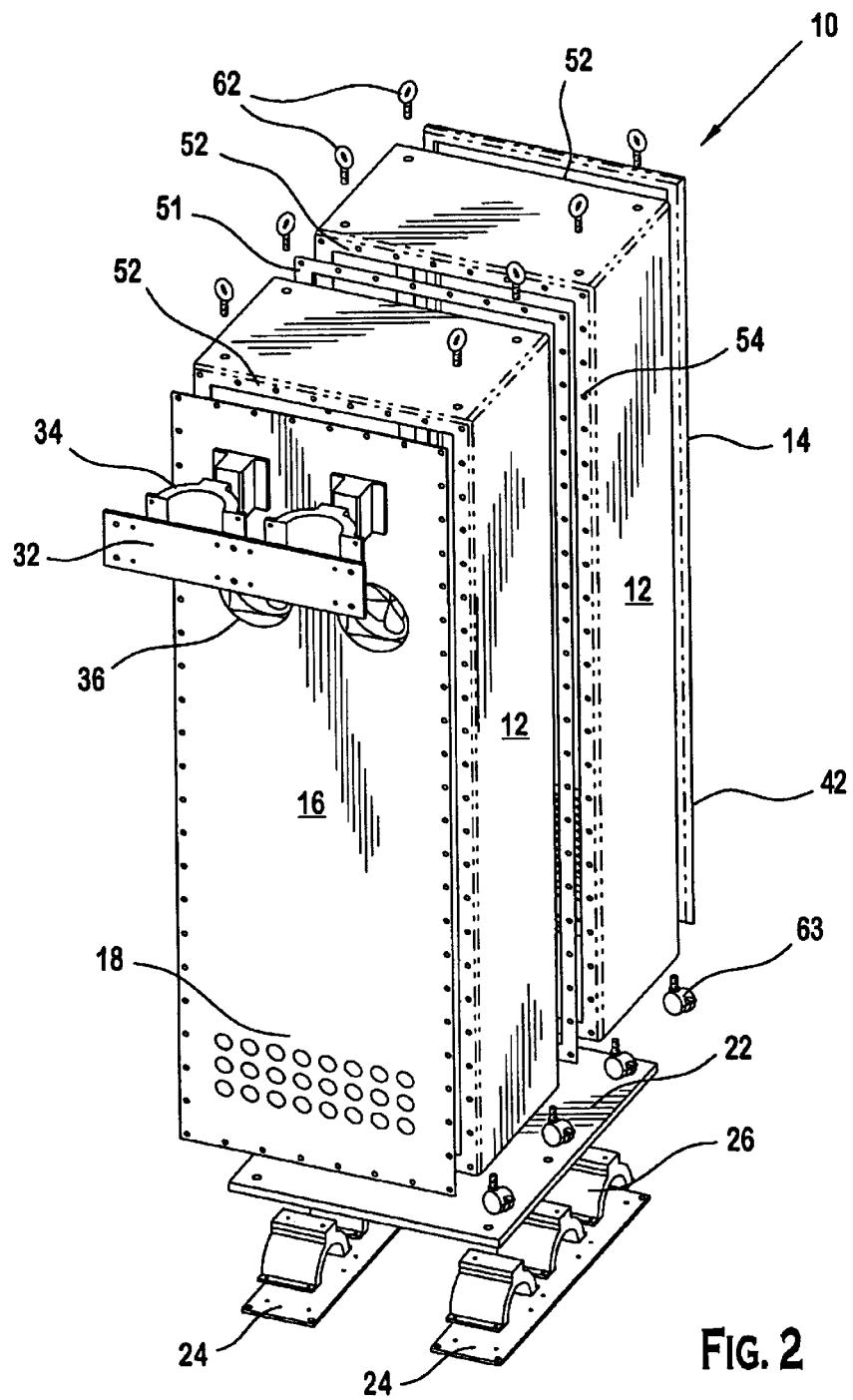
FIG. 2 depicts an exploded view of modules and end panels of the electronic housing of the present invention.

With reference now to FIGS. 1 and 2, there is depicted a representation of an electronic housing 10 of the present invention. Additionally, the electronic housing system of the present invention utilizes special components, called housing modules 12, which allow for convenient adjustment of the internal volume of the housing. The housing can be easily assembled and disassembled, allowing each component to be passed through small openings, such as a window or a ship's hatch. Once reassembled inside a ship, for example but not limited thereto, the housing can still ensure the required environmental protection, particularly in terms of electromagnetic shielding and drip-proof protection. A 72" high, 24" wide, 30" deep housing (for example) could be easily installed inside a submarine using a standard 24" diameter hatch. The electronic housing, scope of the invention, fulfills all environmental military requirements, including but not limited to electromagnetic interference and drip-proof. Cabling and wiring of the electronic housing is tied in one of the modules constituting the housing, allowing easy onboard installation by simple disassembly of the housing but without removing cables and bundles from inside the module.

The present invention allows for easy dimensional upgrades even after delivery. This is accomplished by adding an extra housing module, removing an existing module, or replacing an existing module by another with different dimensions. Thus, the present invention is highly advantageous as compared to existing electronic housings, which must be replaced when conditions impose changes in the size requirements of the electronic sub-assemblies.

While any number of modules may be utilized, FIGS. 1 and 2 depict an exemplary housing with two modules, for illustrative purposes only. The modules are shown arranged front to back, and include end panels 14, 16, with the front end panel 14 in the form of a door and the rear end panel 16 in the form of a connector panel. A plurality of drilled holes 18, as shown in FIG. 1, can be used for mounting electrical connectors.

Figure 5:
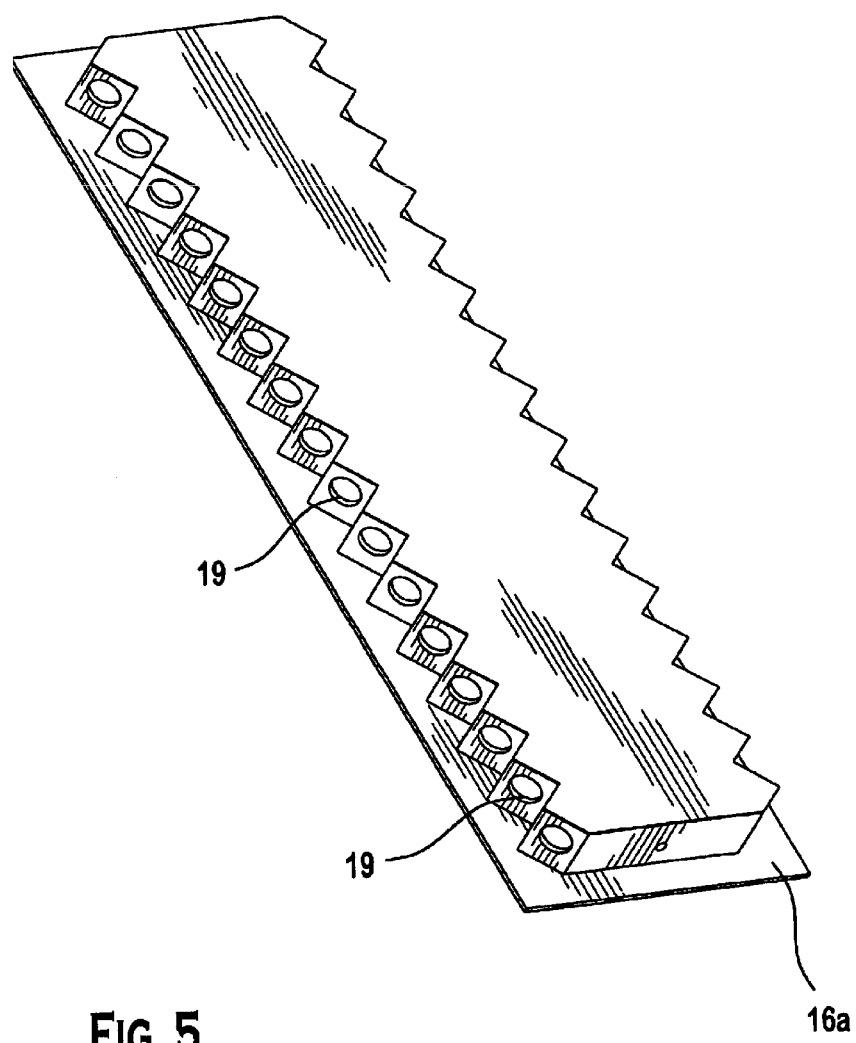
FIG. 5 depicts an example of a connector box that can be used in place of a flat plate at the rear of the housing.

The end panels may be in the form of a single flat plate, as shown in FIGS. 1 to 4. Alternatively, the rear end panel 16a may include razorback openings 19, an example of which is shown in FIG. 5. The rear end panel 16a is connected to the rear housing module 12 such that the protrusion containing the razorback openings 19 extends in the rearward direction resulting in an increased interior volume of the housing. The razorback openings 19 provide for cable connection, such as by being used for mounting electrical connectors.

Air inlet and outlet openings may be provided, and may include a mesh or filter window 42, fans 36. The use of mesh or filter material in the openings also provides additional electromagnetic interference protection. Where necessary, an air to liquid heat exchanger may also be provided.

Particularly when used on a ship, the base of the housing may be fastened onto a floor plate 22, which attachment may either be accomplished by bolts and nuts, or any other means of fastening. The housing may be isolated from shock and vibration by utilizing shock mounts 26 or a cable system attached to the floor plate. Nevertheless, other systems that perform a similar function may be substituted. Interface plates 24 may also be utilized when shock mounts are used. For additional stability, as well as shock and vibration absorption, shock mounts 34 may be placed on the end panel or even the sides or top panel, and attached to the wall of the ship or bulkhead via an interface plate 32.

In a different housing arrangement, shock mounts can also be installed inside the electronic housing. In this configuration, the housing is bolted rigidly to the ship or vessel or vehicle or building structure, and electronic sub-assemblies inside the housing are isolated locally from shock and vibration. The electronic sub-assemblies can also be mounted rigidly on an inner frame. The inner frame is protected against shock and vibration by means of shock mounts attached between this inner frame and the electronic housing.

The wiring may be conveniently placed inside the rear module and tied to the sides, which may be facilitated by use of perforated grid panels, plastic ties, hook and loop ties, or any other practical means. During assembly, cables and bundles may first be tied on the rear module or on the module where the connector plate is attached, thereby permitting installation of each module inside the ship without having to remove all the wiring included during the integration phase at the factory. Disassembly of the housing may be accomplished without removal of internal wiring, which is generally set up during the integration phase.

In order to provide electromagnetic shielding and drip proof protection between the different modules of the housing, one or more gaskets 51 may be provided and positioned against the gasket interface 52 of each module.

Some materials that may be utilized for the gaskets are rubber or silicone foam for the drip proof protection, and monel, tined-copper-steel (copper-steel material coated with tin), or copper beryllium springs for the electromagnetic shielding. Nevertheless, it would be evident to one of ordinary skill in the art that other practical means may be utilized to shield and protect the housing and its contents.

A plurality of holes 54, with or without threads, may be provided at various locations and patterns to allow for assembly and transport of the housing. Assembly of the housing may be accomplished by insertion of bolts 55 through the holes 54 in the gasket interface 52 between the modules 12, as shown in the enlarged view of the circled portion of FIG. 3. In order to facilitate easier transport of the housing eyebolts 62 may be provided on the top or side of the housing and/or small wheels 63 may be provided on the bottom of the housing. This provides for convenience in installation on board ships, by hanging the modules to pass from deck to deck or rolling the modules in the passageways. The wheels could also be provided during operational phases to facilitate displacement of the housing within the ship, which is often required for testing or maintaining equipment. Attachment of the housing modules to each other may be accomplished by means of screws, bolts, washers and nuts. If required, latches or any fast locking feature hardware may be substituted to allow for faster assembly. When circumstances require it, hinges may be provided on one side and latches on the other. Additionally, hardware may be provided that would obviate the need for tools in the assembly of the various housing components.

Each individual module of the present invention may be further equipped with removable side panels, so as to provide for convenient access to electronic sub-assemblies during the wiring and integration phases of installation. The removable side panels may also be used as connector panels, when a lateral location for the connectors is required. Additionally, windows to provide for viewing and/or access may also be included.

After assembly of the various housing components, horizontally sliding rails may be fitted inside the housing modules, thereby adding to the stiffness of the entire structure. Additionally, adjustable rails may be substituted and used for the standard EIA vertical rails, in either one or both of the front and rear.

All standard protection devices may be used with the present invention. Some examples, but not limited thereto, include thermal switches for high temperature protection, and anti-condensation heater for humidity control monitored through a dew point sensor. A further example is an air flow sensor for gauging speed of circulation air within the housing, such as may be generated by the fans 36.

While the invention has been described by reference to certain preferred embodiments, it should be understood that numerous changes could be made within the spirit and scope of the inventive concept described. Accordingly, it is intended that the invention not be limited to the disclosed embodiments, but that it have the full scope permitted by the following claims, as properly construed.

The invention claimed is:

1. A modular electronic housing, comprising:
   a plurality of modules, at least one of said modules including a plurality of bolt holes, so as to provide for attachment of various components and other modules, each of said modules having a gasket interface against which a gasket may be placed for electromagnetic shielding or drip proof protection;

at least one end panel removably attached to one of said modules to provide access to the interior of said plurality of modules; and means for support of said electronic housing to provide for isolation for said components within said electronic housing from vibration or shock.

2. An electronic housing according to claim 1, and further comprising a ventilation or cooling system.

3. An electronic housing according to claim 2, wherein said ventilation or cooling system includes a mesh window.

4. An electronic housing according to claim 2, wherein said ventilation or cooling system includes a filter.

5. An electronic housing according to claim 1, and further comprising means for conveying said plurality of modules.

6. An electronic housing according to claim 5, wherein said means for conveying said plurality of modules includes eyebolts to provide for hoisting of said modules.

7. An electronic housing according to claim 5, wherein said means for conveying said plurality of modules includes wheels to provide for rolling of said modules.

8. An electronic housing according to claim 1, wherein said means for support of said electronic housing includes a floor plate for attachment to said modules.

9. An electronic housing according to claim 8, and further comprising a shock mount, or a shock mount and an interface plate.

10. An electronic housing according to claim 1, wherein said means for support of said electronic housing includes a shock mount, or a shock mount and an interface plate.

11. A modular electronic housing, comprising:

a first module having a first wall defining a first chamber, a first front opening, and a first back opening, the first wall having a seal interface at the first front opening and the first back opening;

a second module having a second wall defining a second chamber, a second front opening, and a second back opening, the second wall having a seal interface at the second front opening and the second back opening;

an electromagnetic seal formed between the first back opening seal interface and the second front opening seal interface; and a third wall removably attached to the first front opening seal interface, the third wall providing access to the first and second chambers.

12. The modular electronic housing according to claim 11, wherein the first and second chambers each being defined as a rectangular prism approximately 72" in height, 24" in width, and 30" in depth;

each seal interface defines a plurality of holes for receiving fasteners; and the electromagnetic seal includes a gasket, the gasket being formed of a metal.

13. The modular electronic housing according to claim 12, wherein the gasket is formed of one of monel, tinned copper steel, copper beryllium and tinned copper nickel.

14. The electronic housing according to claim 11, further comprising:

a first tie member disposed within the first chamber;

a second tie member disposed within the second chamber;

an electronic component disposed within the first and second chambers; and a third tie member being connected to the electronic component;

wherein the second module is detachable from the first module without detaching the first and second tie members from respective modules; and wherein the electronic component is removable from the first and second chambers prior to the second module being detached from the first module.

* * * * *